(12) United States Patent
Privitera (10) Patent No.: US 9,159,652 B2
(45) Date of Patent: Oct. 13, 2015

(54) ELECTRONIC DEVICE COMPRISING AT LEAST A CHIP ENCLOSED IN A PACKAGE AND A CORRESPONDING ASSEMBLY PROCESS

(71) Applicant: STMicroelectronics S.r.l., Agrate Brianza (IT)

(72) Inventor: Concetto Privitera, Gravina di Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 14/183,156

(22) Filed: Feb. 18, 2014

(65) Prior Publication Data

US 2014/0239502 A1   Aug. 28, 2014

(30) Foreign Application Priority Data

Feb. 25, 2013   (IT) .............................. MI2013A0267

(51) Int. Cl.
*H01L 29/267* (2006.01)
*H01L 33/00* (2010.01)
(Continued)

(52) U.S. Cl.
CPC .............. *H01L 23/481* (2013.01); *H01L 21/56* (2013.01); *H01L 21/76877* (2013.01); *H01L 23/28* (2013.01); *H01L 23/49562* (2013.01); *H01L 24/16* (2013.01); *H01L 24/32* (2013.01); *H01L 24/73* (2013.01); *H01L 24/81* (2013.01); *H01L 24/83* (2013.01); *H01L 24/92* (2013.01);
(Continued)

(58) Field of Classification Search
USPC ....................................... 257/762, 676, 81, 99
See application file for complete search history.

(56) References Cited

U.S. PATENT DOCUMENTS

2002/0003302 A1 * 1/2002 Watanabe et al. ............. 257/754
2002/0017710 A1   2/2002 Kurashima et al.
(Continued)

FOREIGN PATENT DOCUMENTS

EP    0 863 548 A2   9/1998
JP    11-111771 A    4/1999
(Continued)

OTHER PUBLICATIONS

Wikipedia, "Solder", Feb. 23, 2013, 27 pages.

*Primary Examiner* — Khiem D Nguyen
*Assistant Examiner* — Wilner Jean Baptiste
(74) *Attorney, Agent, or Firm* — Seed IP Law Group PLLC (57) ABSTRACT

An electronic device is described comprising at least one chip enclosed in a package, in turn provided with a metallic structure or leadframe having a plurality of connection pins, this chip having at least one first contact realized on a first face and at least one second contact realized on a second and opposite face of this chip. The chip comprises at least one through via crossing the whole section of the chip as well as a metallic layer extending from the second contact arranged on the first face, along walls of the at least one through via up to the second and opposite face in correspondence with an additional pad. The electronic device comprises at least one interconnection layer for the electrical and mechanical connection between the chip and the metallic structure having at least one portion realized in correspondence with the at least one through via so as to bring the second contact placed on the second face of the chip back on its first face. An assembly process of such an electronic device is also described.

14 Claims, 6 Drawing Sheets

(51) Int. Cl.
  *H01L 29/40* (2006.01)
  *H01L 23/48* (2006.01)
  *H01L 21/56* (2006.01)
  *H01L 21/768* (2006.01)
  *H01L 23/28* (2006.01)
  *H01L 23/495* (2006.01)
  *H01L 23/00* (2006.01)
  *H01L 23/31* (2006.01)

(52) U.S. Cl.
  CPC .............. *H01L23/3107* (2013.01); *H01L 24/02* (2013.01); *H01L 24/05* (2013.01); *H01L 24/06* (2013.01); *H01L 24/13* (2013.01); *H01L 24/29* (2013.01); *H01L 24/30* (2013.01); *H01L 2224/02372* (2013.01); *H01L 2224/0401* (2013.01); *H01L 2224/04026* (2013.01); *H01L 2224/05009* (2013.01); *H01L 2224/05572* (2013.01); *H01L 2224/0603* (2013.01); *H01L 2224/06051* (2013.01); *H01L 2224/133* (2013.01); *H01L 2224/13009* (2013.01); *H01L 2224/13025* (2013.01); *H01L 2224/1329* (2013.01); *H01L 2224/13111* (2013.01); *H01L 2224/16058* (2013.01); *H01L 2224/16145* (2013.01); *H01L 2224/293* (2013.01); *H01L 2224/29009* (2013.01); *H01L 2224/29025* (2013.01); *H01L 2224/2929* (2013.01); *H01L 2224/29034* (2013.01); *H01L 2224/29111* (2013.01); *H01L 2224/3003* (2013.01); *H01L 2224/30051* (2013.01); *H01L 2224/32058* (2013.01); *H01L 2224/32245* (2013.01); *H01L 2224/73203* (2013.01); *H01L 2224/8185* (2013.01); *H01L 2224/81121* (2013.01); *H01L 2224/81192* (2013.01); *H01L 2224/81447* (2013.01); *H01L 2224/81815* (2013.01); *H01L 2224/81855* (2013.01); *H01L 2224/83121* (2013.01); *H01L 2224/83192* (2013.01); *H01L 2224/83447* (2013.01); *H01L 2224/83815* (2013.01); *H01L 2224/83851* (2013.01); *H01L 2224/83855* (2013.01); *H01L 2224/9201* (2013.01); *H01L 2224/9211* (2013.01); *H01L 2924/00014* (2013.01); *H01L 2924/1305* (2013.01); *H01L 2924/13055* (2013.01); *H01L 2924/13091* (2013.01)

(56) References Cited

U.S. PATENT DOCUMENTS

| | | |
|---|---|---|
| 2006/0071242 A1 | 4/2006 | Frisina et al. |
| 2006/0071271 A1 | 4/2006 | Omura et al. |
| 2007/0080355 A1* | 4/2007 | Lin et al. .................... 257/81 |
| 2007/0080360 A1* | 4/2007 | Mirsky et al. ................ 257/99 |
| 2008/0142883 A1 | 6/2008 | Grebs et al. |
| 2009/0278245 A1* | 11/2009 | Bonifield et al. ............. 257/676 |
| 2009/0315175 A1 | 12/2009 | Okada et al. |
| 2010/0155962 A1 | 6/2010 | Inoue et al. |
| 2012/0104580 A1 | 5/2012 | Feng et al. |

FOREIGN PATENT DOCUMENTS

| | | |
|---|---|---|
| JP | 2009-54611 A | 3/2009 |
| WO | 2006/138489 A2 | 12/2006 |

* cited by examiner

ELECTRONIC DEVICE COMPRISING AT LEAST A CHIP ENCLOSED IN A PACKAGE AND A CORRESPONDING ASSEMBLY PROCESS

BACKGROUND

1. Technical Field

The present invention relates to an electronic device comprising at least one chip enclosed in a package.

2. Description of the Related Art

As it is well known, the present and more recent electronic devices, in particular for power applications, are the result of innovations relating both silicon (chip) and package.

Generally described, an electronic device normally comprises a chip, which is the core of the device and a package, which is used with the aim of protecting the chip. In particular, the package is also configured to ensure that electrical connections of the chip itself can be accessed from the outside, such for a PCB (acronym from the English: "Printed Circuit Board") whereon the final device is mounted.

The electrical contacts of the chip, usually indicated as electrodes, are then brought back on external pins or leads of the package through suitable interconnections realized with conductive materials, such as metallic, among which, gold, copper or aluminum, to name a few.

Among the various factors that have led and continue to lead the evolution of the electronic devices the following ones, for example, are significant:

the desire for reducing the area of the PCBs, in particular in portable applications, that pushes towards electronic devices being less bulky, such as having a low thickness and a reduced weight; and the desire for improving the global electrical performances of these electronic devices, that can be heavily downgraded by the package and in particular by the specific interconnections for making the electric contacts of the chip comprised therein available from the outside of the package through the pins.

Several efforts have been already made for realizing more compact chips with the functions performed remaining the same, so as to reduce the total space of the electronic device that comprises them. The capacity of realizing this type of compact chips is linked to the new technologies of diffusion on silicon (photolithographic processes etc.) that allow for greater packaging density.

Considering for example the well known power metal-oxide-semiconductor (MOS) devices, commonly indicated as PowerMOSFET, the evolution of the photolithographic technologies has allowed to switch from the tenth of millions of equivalent cells/inch$^2$ of the beginning of the century up to the present hundred of millions of equivalent cells/inch$^2$.

Obviously, the miniaturization of the silicon chips is typically accompanied by a corresponding miniaturization of the package that comprises them. In particular, the packages are characterized, as to the dimensional aspects, by the ratio between a maximum value of embedded silicon area (i.e., the area of the chip) and a minimum value of the space desired for the assembly of the package itself on the PCB board, also referred to as a foot print. It is emphasized that this ratio has already been reduced from a value of about 0.3 in the early 1990s, to a present value of about 0.9.

It is evident that the value of this ratio of areas is strongly influenced also by the techniques of interconnection between chip and package that request to allocate suitable space inside the package itself. Electric interconnections are generally realized by means of wires of conductive material (realized in aluminum, gold or copper, for indicating a few of them) or, in the most recent technologies, through metallic ribbons, in particular of aluminum (indicated as "Al Ribbon") or metallic clips, in particular of copper (indicated as "Copper clip or bridge"), shown hereafter in greater detail.

It is emphasized that exactly these interconnections can in reality be responsible for possible degradations of the electrical performances of the electronic device as a whole. Considering still by way of an example the PowerMOSFET devices, a single wire of 2 mils (being the mil a unity of length of the English system particularly used in the electrotechnical engineering for the sections of the conductors, equal to $\frac{1}{1000}$ of inch and thus to 25.4 μm) of gold (material widely used in the industry of semiconductors) introduces a contribution of about 20 milliOhm on the total resistance value at the turn on or ON resistance of a typical PowerMOSFET device.

Considering that there exist power electronic devices currently manufactured with a total ON resistance of about 1 milliOhm (including the contribution of the silicon chip and of the package) there is a desire for realizing the metallic interconnections by using several metallic wires, in particular bonding wires, in a parallel configuration so as to reduce the parasite components introduced by the package by virtue of these interconnections and thus its contribution to the total ON resistance of the device as a whole.

Figure 1:
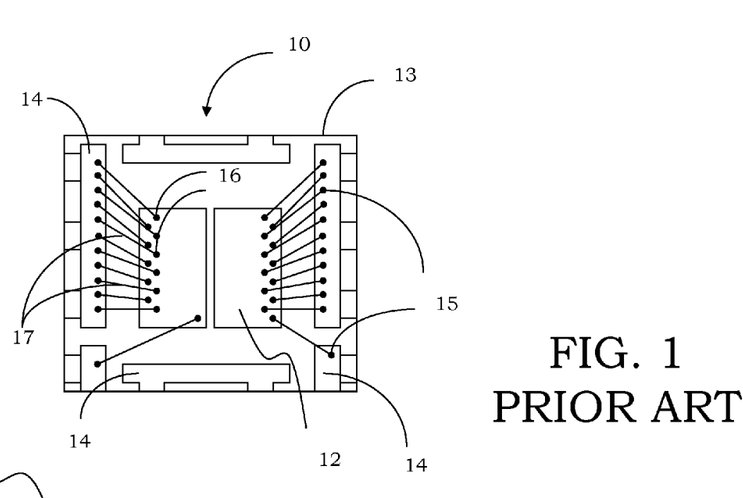
FIG. 1 schematically shows an electronic device comprising a chip enclosed by a package with a configuration of bonding wires in parallel realized according to the prior art.

An example of a configuration of bonding wires in parallel is schematically shown in FIG. 1. In particular, this figure shows an electronic device 10 comprising a chip 12 enclosed by a package 13 provided with a plurality of contact regions 14. Respective pluralities of contact points, 15 and 16, realized on the chip 12 and on the contact regions 14 of the package 13, respectively, are connected by means of bonding wires 17.

From the configuration shown in FIG. 1, it is evident that the bonding wires 17, besides contributing to the potential decay of the electric performances of the electronic device 10 as a whole, are also a limit in the reduction of the global thickness of the package 13 that has to contain them, also due to the geometry necessary to avoid contact between these wires and the edge of the chip.

Figure 2:
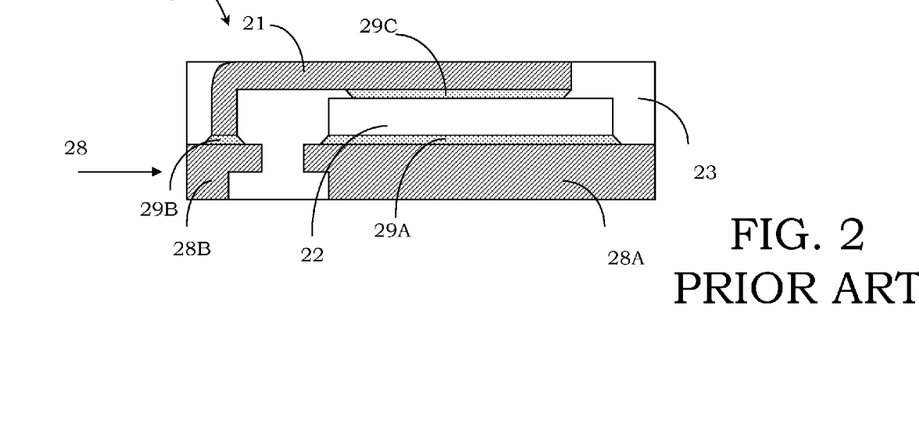
FIGS. 2, 3 and 4 schematically show electronic devices comprising a chip enclosed by a package realized according to the prior art.

For improving the performance of the electric interconnections between chip and package, it is also known to use the so called metallic clip technique, for example in Copper or "copper clip", schematically shown in FIG. 2.

According to this metallic clip technique, an electronic device 20 comprises a chip 22 enclosed in a package 23, in turn provided with a metallic structure or leadframe 28, in particular of copper, which comprises at least one portion 28A whereon the chip 22 is laid, for example with the interposition of a first layer of solder alloy 29A.

The electronic device 20 also comprises a metallic clip 21, for example in copper, solidarized or united by means of interposition of a second layer of solder alloy 29B onto a further portion 28B of the leadframe 28, separated with respect to the portion 28A whereto the chip 20 is united. In particular, the metallic clip 21 has a substantially inverted L shape and is united also to the chip 22 by means of a third layer of solder alloy 29C.

Alternatively, it is possible to use, in place of the metallic clip 21, so called metallic ribbons, for example of aluminum, also suitably connected between the front of the chip and a portion of the leadframe separated with respect to a further portion whereto the chip is united.

At present there are also electronic devices available provided with a package of very reduced size. For example, in the family of the QFN (acronym of: "Quad-Flat No-Leads") or DFN (acronym of: "Dual Flat No Lead") packages it is possible to realize electronic devices with total thicknesses lower than 0.4 mm. In this case, the package is suitably provided with at least one planar leadframe that realizes its substrate and a plurality of peripheral regions that allow the connection of the package to the PCB board. These packages can be also provided with an exposed thermal region for facilitating the transfer of heat outside the package itself.

Besides the problems linked to the miniaturization and to the performances above shown for the electronic devices housed in package, it is also to be emphasized that, in the case of power applications, the most recent devices introduce further design complications linked to the vertical conduction of the current that is realized therein.

In fact, a vertical power device comprises, besides one or more electrodes arranged on a first face thereof, indicated for example as front of the device, also at least one electrode arranged on a second and opposite face thereof, indicated as back of the device.

In the case of a vertical conduction PowerMOSFET device, usually the drain contact is placed on the back, while the gate and source contacts are on the front.

For improving the electric performances of the device, minimizing the interconnections between silicon and package, it is thus desired to succeed in efficiently bringing all the contacts (in particular the drain contact in the case of a vertical PowerMOSFET device) back on a same face or surface of the device itself, everything without excessively damaging the electric performances of the chip comprised therein.

Figure 3:
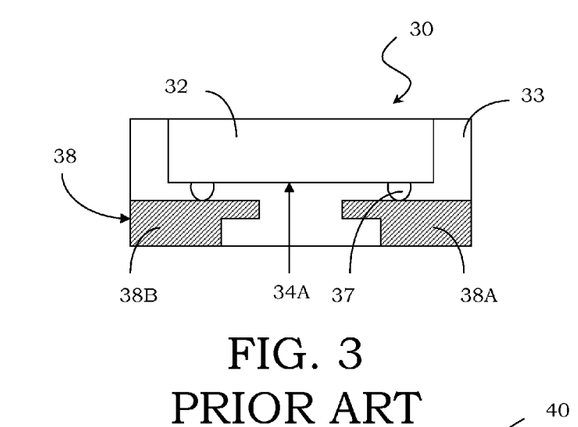

It is thus possible, also for vertical conduction devices, to use packages of reduced size, such as for example the FCOL package (acronym of "Flip Chip On Lead-frame") wherein the chip is assembled so as to have all the contact terminals faced towards a leadframe of the package itself, as schematically shown in FIG. 3. In particular, an electronic device 30 is shown comprising a chip 32 enclosed by a package 33. The chip 32 comprises contacts on one face 34A thereof and is housed in the package 33 with this face 34A faced towards a leadframe 38 also comprised in the package 33. Ball grids or bumps 37 are used for realizing the electric contact between the terminals of the chip 32 arranged on its face 34A and at least one first 38A and one second portion 38B of the leadframe 38.

Packages like FCOL packages, due to the absence of wires for the interconnections between chip and package, allow for maximizing the ratio of areas between "chip size" and "package footprint" having almost equal values, close to 1.

As said, the use of these packages with excellent ratios of areas in the case of vertical conduction devices, in particular vertical power devices, is tied to an efficient configuration of its contacts, in particular to the possibility of bringing back onto the front of the chip the contacts placed on the back.

Figure 4:
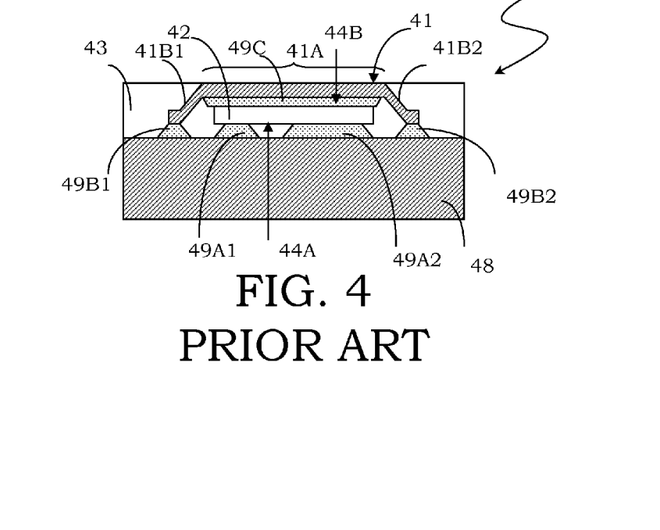

A known solution for bringing the drain electrode back to the same level of the source and gate electrodes of a PowerMOSFET device is the so called "package oriented" solution, schematically shown in FIG. 4.

In particular, this figure shows an electronic device 40, in particular a vertical conduction power device, comprising a chip 42 enclosed in a package 43, in turn provided with a leadframe 48 whereon the chip 42 is laid, in particular with the interposition of at least one first layer of solder alloy 49A1 and a second layer of solder alloy 49A2. More in particular, the first layer of solder alloy 49A1 is placed in correspondence with a gate contact while the second layer of solder alloy 49A2 is placed in correspondence with a source contact, both realized on a first face 44A of the chip 42. A drain contact is instead realized on a second and opposite face 44B of the chip 42.

The electronic device 40 thus comprises a metallic bridge structure 41 having at least one substantially planar portion 41A, placed in contact with the second face 44B of the chip 42 and united to it by means of a third layer of solder alloy 49C. The metallic bridge structure 41 is also provided with respective wings 41B1 and 41B2 that start from the substantially planar portion 41A and go down to the leadframe 48 from opposite positions with respect to the chip 42; the wings 41B1 and 41B2 are also united to the leadframe 48 by means of a fourth layer of solder alloy 49B1 and a fifth layer of solder alloy 49B2, respectively. In this way, the metallic bridge structure 41 substantially takes the shape of an inverted C wherein the chip 42 is placed and realizes the connection of the drain contact placed on its second face 44B to the leadframe 48, bringing in this way all the contacts of the chip 42 to the level of the leadframe 48.

It is also possible, alternatively, still in the case of a vertical conduction power device, to use a so called "die oriented" solution, in which metal or silicon sinkers are used for bringing the drain contact placed on the back of the chip back on its front. Solutions of this type are described for example in US patent applications No. 2008/0142883 published on Jun. 19, 2008 and No. 2006/0071242 published on Apr. 6, 2006.

These solutions utilize, however, the realization of suitable structures inside the chip able to bring all its contacts, in particular the gate, source and drain contacts for a vertical conduction power device such as a PowerMOSFET, back on a same face of the chip itself.

One or more embodiments of the present disclosure is directed a particular configuration of a device comprising at least one chip encapsulated in a package, in particular a vertical conduction power device, having such structural and functional features as to allow for efficiently and simply bringing an electrode placed on a face of the chip, for example a drain contact placed on the back of the chip, back on an opposite face whereon there are other contacts, for example the gate and source contacts placed on the front of the chip, overcoming one or more of the limits and drawbacks affecting the devices as described above.

BRIEF SUMMARY

One or more embodiments are directed to an electronic device comprising at least one chip enclosed in a package, in turn provided with a metallic structure having a plurality of connection pins, this chip having at least one first contact realized on a first face and at least one second contact realized on a second and opposite face of the chip. In particular, one embodiment is directed to electrically connecting a face, in particular the back, of a silicon chip, to a suitable pad placed on an opposite face, in particular the front, of the chip, where there are already other possible electrodes of the chip itself, through suitably metallized through holes (through silicon vias).

One embodiment of the present disclosure is an electronic device comprising at least one chip enclosed in a package, in turn provided with a metallic structure or leadframe having a plurality of connection pins, this chip having at least one first contact realized on a first face and at least one second contact realized on a second and opposite face of the chip, characterized in that the chip can comprise at least one through via crossing the whole section of the chip as well as a metallic layer extending from the second contact arranged on the second face, along walls of the at least one through via up to the first and opposite face in correspondence with an additional pad and in that the electronic device can comprise at least one interconnection layer for the electrical and mechanical connection between the chip and the metallic structure having at least one portion realized in correspondence with the at least one through via so as to bring the second contact placed on the second face of the chip back on its first face.

Furthermore, other embodiments of the disclosure may comprise the following supplementary and optional features, taken alone or in combination.

According to an aspect of the disclosure, the at least one through via can be filled in with a conductive material that realizes a non-rectifying contact with the metallic layer.

According to another aspect of the disclosure, the filling conductive material of the at least one through via can realize at least the portion of the interconnection layer in correspondence with the at least one through via.

Moreover, the filling conductive material can be chosen between a solder paste and a conductive glue.

According to another aspect of the disclosure, the electronic device can comprise at least one further metallic layer realized on the first face of the chip, in correspondence with the first contact.

Furthermore, this additional pad can comprise a plurality of contact areas realized by a plurality of through vias filled in with a conductive material and by a plurality of portions of the conductive material, arranged on the metallic structure in correspondence with these through vias.

According to this aspect of the disclosure, the plurality of contact areas can be aligned along an edge region of the chip, can have any shape and can also comprise contact areas with an elongated shape, in particular substantially rectangular.

According to a further aspect of the disclosure, the through vias can have walls arranged along the section of the chip, substantially perpendicular to a plane defined by the chip and suitably coated by the metallic layer.

Moreover, the through vias can have circular holes with a diameter in the range between 0.1 mm and 0.7 mm.

The through vias can also comprise a linear trench filled in with a suitable conductive material.

According to another aspect of the disclosure, the chip can comprise a vertical conduction power device.

In particular, this vertical conduction power device can be chosen between a MOS transistor, an insulated-gate bipolar transistor (IGBT) transistor, a bipolar junction transistor (BJT) transistor or a diode.

Moreover, according to an aspect of the disclosure, the metallic structure can be divided into at least one first portion provided with at least one first contact pin and one second portion, physically separated from the first portion and in turn provided with at least one second contact pin, the at least one through via being realized in correspondence with the second contact pin and the interconnection layer having at least one portion arranged between the second contact pin and the at least one through via so as to put into contact the second contact realized on the second face of the chip with the second contact pin.

According to this aspect of the disclosure, the interconnection layer can have at least one further portion arranged between the first contact pin and the first contact realized on the first face of the chip.

Furthermore, according to this aspect of the disclosure, the first portion of the metallic structure can comprise a first plurality of contact pins and the second portion of the metallic structure can comprise a second plurality of contact pins, the interconnection layer having respective portions arranged between the first plurality of contact pins and the first pad connected to the first contact realized on the first face of the chip and between the second plurality of contact pins and the further pad connected to the second contact realized on the second face of the chip.

Still according to this aspect of the disclosure, the second portion of the metallic structure can comprise a third plurality of contact pins, the interconnection layer having further portions arranged between the third plurality of contact pins and a further pad connected to a further contact realized on the first face of the chip.

Finally, according to another aspect of the disclosure, the conductive material can have a very high electric conductivity and comprise, for example but not limited to, a metallic alloy Pb/Sn/Ag.

The problem is also solved by an assembly process of an electronic device comprising at least one chip enclosed in a package in turn provided with at least one metallic structure having a plurality of connection pins, the process comprising the steps of:

arranging at least one chip provided with at least one through via that crosses it and is coated by a metallic layer extending between a first face of the chip whereon at least one first contact is realized and a second face of the chip whereon at least one second contact is realized and along walls of the at least one through via; and arranging at least one metallic structure for the housing of the chip, characterized in that it further comprises the steps of:

depositing a conductive material on the metallic structure for the electric and mechanic connection with the chip;

picking the chip from a semiconductor wafer, after a suitable separation phase and rotating the chip so as to arrange the first face in front of the metallic structure and of the conductive material arranged thereon; and making the chip adhere to the metallic structure, so that the at least one through via provided in the chip is aligned with a portion of the conductive material; and distributing the conductive material so that it takes contact with the walls of the at least one through via and goes up inside the same filling it up and thus realizing a contact extended between the second face and the first face of the chip and in particular between the second contact realized on the second face and an additional pad realized on the first face by the metallic layer so as to bring the second contact placed on the second face of the chip back on its first face.

According to an aspect of the disclosure, the step of arranging at least one metallic structure for the housing of the chip can realize a structure being divided into at least one first portion provided with a plurality of first contact pins and a second portion, being physically separated from the first portion and in turn provided with at least one second plurality of contact pins and the step of depositing a conductive material can provide to realize a plurality of portions of an interconnection layer in correspondence with each contact pin.

According to another aspect of the disclosure, the second portion of the metallic structure can comprise also a third plurality of contact pins and the conductive material can realize further portions of the interconnection layer also in correspondence with the third plurality of contact pins.

Moreover, the step of distributing said interconnection layer can comprise a step of realizing a connection between the second plurality of contact pins with the first contact being on the first face of the chip.

According to this aspect of the disclosure, the step of distributing the interconnection layer can comprise a step of realizing a connection between the third plurality of contact pins and at least one further contact being on the first face of the chip.

Moreover, according to another aspect of the disclosure, the step of deposition of the conductive material can comprise a step of dispensation of a solder paste, followed by a step of distribution realized by a reflow step, wherein the solder paste, due to a thermal process, melts and goes up by capillarity inside the at least one through via or the step of deposition of the conductive material comprises a step of dispensation of a conductive glue and a step of pressing of the chip on the dispensed conductive glue suitable for obtaining the lift of the glue inside the at least one through via, followed by a curing step able to harden the conductive glue.

According to another aspect of the disclosure, the step of arranging at least one chip provided with at least one through via can comprise a step of realization of deep trenches in the silicon of the chip or a step of perforation of the chip by laser.

The features and advantages of the electronic device and of the assembly process according to the disclosure will be apparent from the following description of an embodiment thereof given by way of indicative and non limiting example with reference to the annexed drawings.

DETAILED DESCRIPTION

Figure 5:
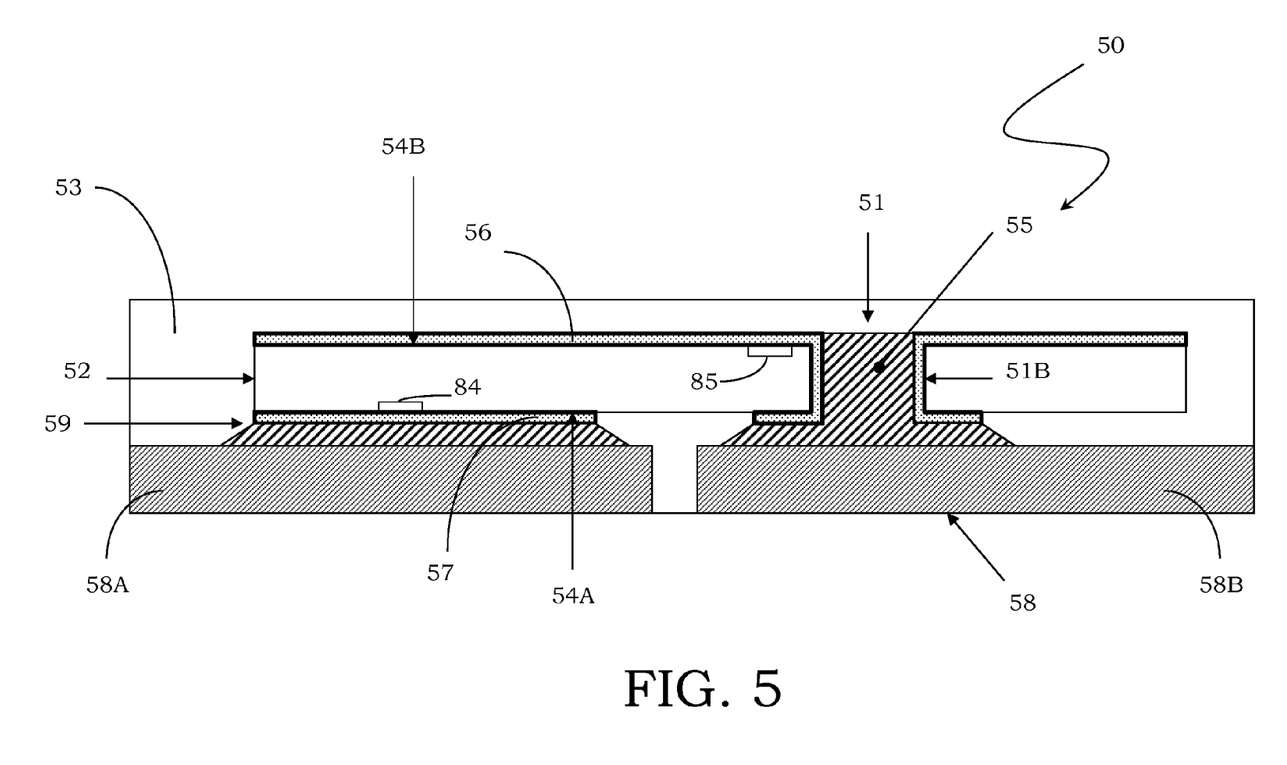
FIG. 5 schematically shows an electronic device comprising a chip enclosed by a package realized according to the disclosure.

With reference to FIG. 5, there is shown schematically an electronic device 50 comprising at least one chip 52 enclosed in a package material 53. The chip 52 and the package material are located over a metallic structure or leadframe 58, in particular of copper. The leadframe 58 is divided into a first portion 58A and a second portion 58B, that are structurally and physically separated from each other and provided with respective pluralities of contact pins or leads, as it will be clarified hereafter.

It is suitable to note that the figures, which show schematic views of portions of the electronic device, are not drawn to scale, but are instead drawn so as to underline the important features of the disclosure.

Advantageously according to the disclosure, the chip 52 is provided with at least one through hole 51 extending through the chip 52.

In one embodiment of the disclosure, the through hole 51 has a diameter on the order of some hundreds of microns and crosses the whole section of the chip 52, realizing a so called "through silicon via", when the chip 52 is made of silicon. The through via 51 has walls 51B along the section of the chip 52, substantially perpendicular to a plane defined by the chip itself and suitably coated with a metallic layer 56.

In a preferred embodiment of the disclosure, the metallic layer 56 extends starting from a first face 54A or front of the chip 52, along the walls 51B of the through via 51 up to a second and opposite face 54B or back of the chip 52. The metallic layer 56 forms, in particular, a non-rectifying contact with a conductive material 55 used for filling the through via 51 in.

Making reference to the example shown in FIG. 5, the metallic layer 56 creates an electric connection between an additional pad formed on the first face 54A, where there is at least one first contact 84 of the chip 52 with at least one further or second contact 85 of the chip 52 arranged on the second face 54B. In particular, in the case of a chip 52 that is a vertical conduction power device of the MOS type, the metallic layer 56 connects a drain contact on the second face 54B of the chip 52 to the additional pad on the first face 54A of the chip 52, where also the source and gate contacts are formed.

According to a further embodiment, the metallic layer 56 also forms the additional pad on the first face 54A.

The electronic device 50 can also comprise a further metallic layer 57 on the first face 54A of the chip 52, in correspondence with this first contact, in particular the source and gate contacts.

Finally, the electronic device 50 comprises at least one interconnection layer 59 for the electrical and mechanical connection between the chip 52 and the leadframe 58. In particular, the interconnection layer 59 comprises at least one portion arranged between the further metallic layer 57 and the leadframe 58, as well as a portion arranged in correspondence with the through via 51 between the metallic layer 56 and the leadframe 58 and in mechanical and electrical contact with the conductive material 55 that fills in the through via 51. In a preferred embodiment, a same conductive material 55 fills in the through via 51 and forms the interconnection layer 59. For example, this conductive material can be a solder paste. Alternatively, a conductive glue or other equivalent conductive material can be used for realizing the interconnection layer 59 and filling in the through vias 51.

Figure 6:
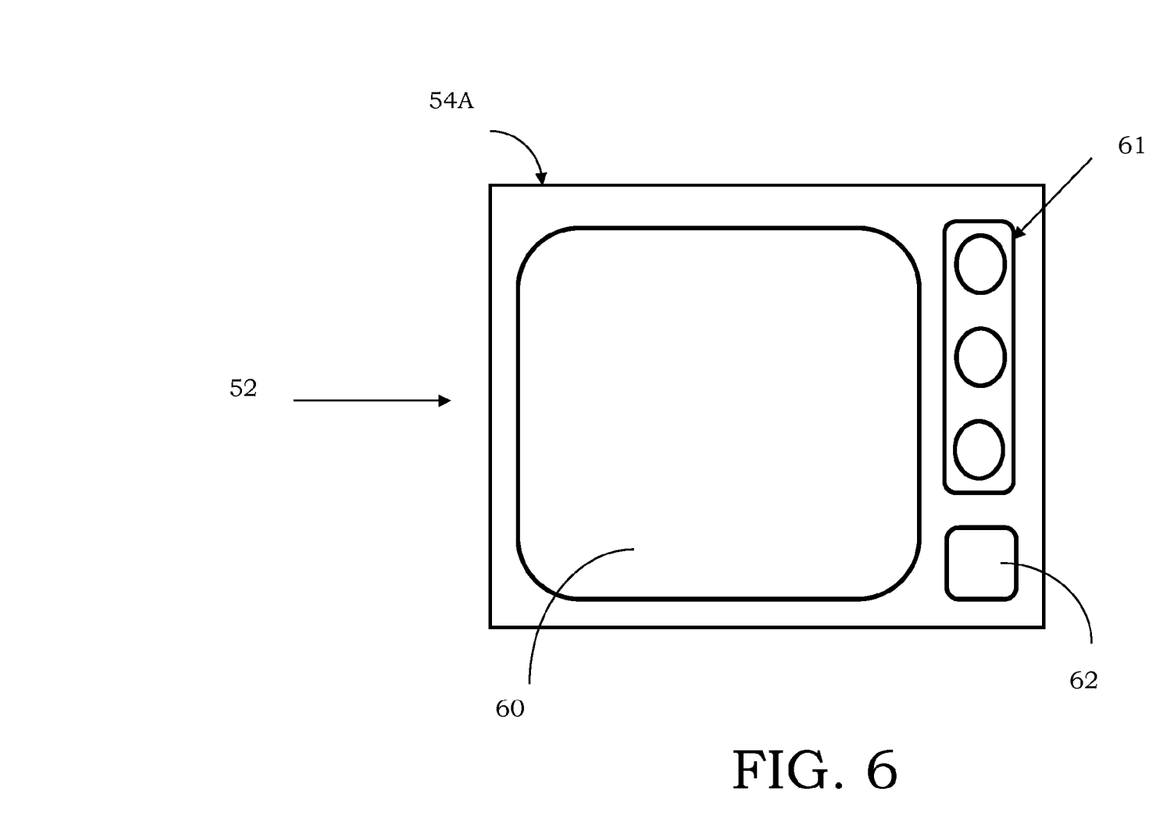
FIGS. 6 and 7 schematically show a chip comprised in the device of FIG. 5.

In this way, the electronic device 50, due to the through via 51 filled in with a conductive material, for lowering the resistivity of the metallic layer 56 on the walls 51B, is able to bring a contact placed on the second face 54B of the chip 52 back onto its first face 54A, where other contacts of the chip 52 are formed, as shown in FIG. 6.

In particular, this figure shows the first face 54A of the chip 52 that comprises at least one first pad 60 on the first face 54A in correspondence with a first contact 84 of the chip 52 on this first face 54A, for example a source contact, as well as an additional pad 61 electrically connected due to the metallic layer 56, and in particular to its portion that covers the walls 51B of the through via 51, to a second contact 85 realized on the second face 54B, for example a drain contact. The first face 54A of the chip 52 can comprise also at least one second pad 62 of a further contact realized on this first face 54A, for example a gate contact.

In the example shown in FIG. 6, the additional pad 61 comprises a plurality of contact areas realized by a plurality of through vias 51 that will be filled in with a conductive material 55, in particular aligned along an edge region of the chip 52, together with the third pad 62.

In a preferred embodiment, the conductive material that fills the through vias 51 in and forms the interconnection layer has a very high electrical conductivity, being for example a metallic alloy Pb/Sn/Ag.

Although the electronic device according to the disclosure has been described as comprising a vertical conduction power MOS (PowerMOSFET), it will be evident for a skilled in the art that the through vias can be used also for other vertical conduction devices, like IGBT transistors, BJT transistors, or diodes, both with a planar structure or comprising trench structures. In general, the through vias as described above can be used for all those devices for which it is desired to bring an electrode placed on the back of the chip back on its front.

Moreover, several through vias can be simultaneously in the layout of the chip so as to obtain the desired structure and suitably relocate contacts on a first face, in particular on the back of the chip, up to its second and opposite face, in particular on the front of the chip, where other contacts are realized.

Furthermore, it is possible to choose the size of the through vias 51, meaning their cross section, the number of the through vias 51 and the filling conductive material as used so as to allow the realization of a contact with excellent electric performances, in particular having a resistance in series in the order to some tenths of milliOhm and an inductance in series in the order of some tenths of a nanohenry, so as to realize an excellent interconnection between a contact of the chip 52 and pin or lead of the leadframe 58 whereon it is housed. Also the shape of the section of the through vias 51 can vary and not be necessarily circular, in particular the shape of the section being adapted to the inner structure of the circuit integrated in the chip 52.

Figure 7:
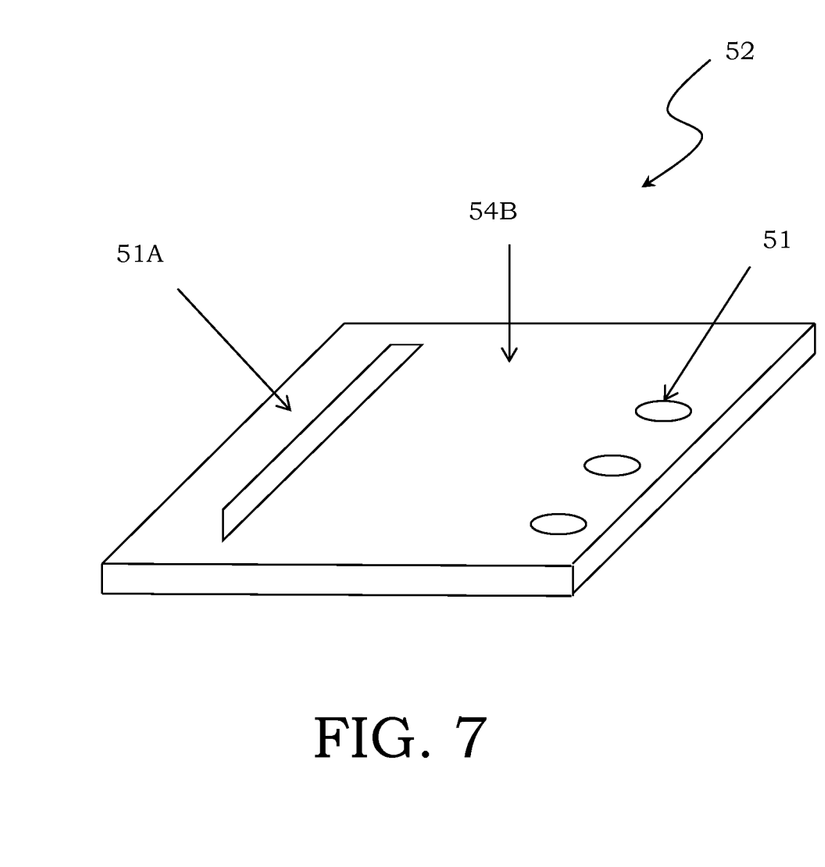

For example, as shown in FIG. 7, it is possible to realize a series of circular through vias 51 aligned or contiguous with each other or to provide a through via 51A having an elongated shape, in particular substantially rectangular and, for example, arranged in parallel to an edge of the chip 52 and subsequently filled in by the conductive material 55.

The through vias 51 can be realized by using several technological processes being well known to the skilled person in the art, making the realization of the electronic device 50 according to the disclosure compatible with the already used process flows, with an evident saving in terms of costs and of resources to be used ad hoc. Among the possible techniques for realizing through vias, it is possible to consider, for example, the realization of deep trenches in the silicon of the chip or the perforation of the same through laser.

In a preferred embodiment, the through vias 51 are circular with a diameter in the range between 0.1 mm and 0.7 mm. It is emphasized that, compatibly with the layout of the chip 20, it is important to maximize this diameter, and in general the size of the through vias 51, so as to reduce the resistive contribution of the same, although taking into consideration the area consumption of silicon utilized for realizing the vias 51. Still in this perspective, it is also possible to increase the number of the through vias 51, compatibly with the integration layout.

Figure 8:
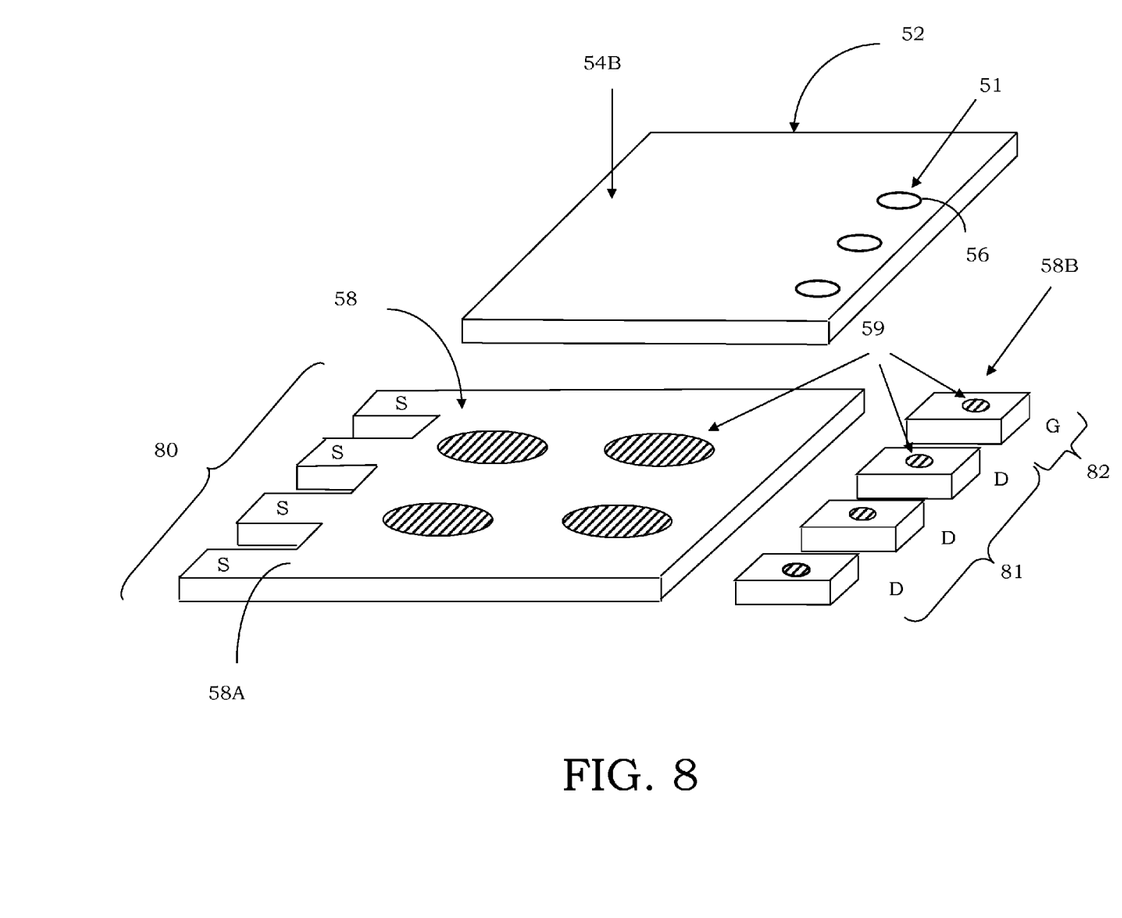
FIG. 8 schematically shows an exploded view of the device of FIG. 5 in a step of its assembly.

The present disclosure also relates to an assembly process of an electronic device comprising a chip enclosed in a containment package, this electronic device having reduced size, as schematically shown with reference to FIG. 8.

As previously seen, the chip 52 comprises at least one through via 51 that goes across the same and is coated by a metallic layer 56 extending between the two faces of the chip itself and along the walls of the through via 51.

Advantageously according to one or more embodiments of the disclosure, the through via 51 is not filled in during the step of forming the chip 52 but during the assembly process of the same in the containment package 53, for example a FCOL package, as it will be clarified hereafter.

More in particular, the assembly process according to the disclosure comprises the steps of:

arranging at least one chip 52 provided with at least one through via 51 that crosses the same and is coated by a metallic layer 56 extending between the two faces of the chip itself and along the walls of the through via 51; and arranging at least one leadframe 58 for the housing of the chip 52, this leadframe 58 being divided into at least a first portion of leadframe 58A provided with a plurality of first contact pins or leads 80 and a second portion of leadframe 58B, physically separated from the first portion of leadframe 58A, and in turn provided with at least a second plurality of contact pins or leads 81 and a third plurality of contact pins or leads 82.

Suitably, in the case of a vertical conduction power device of the MOS type, the first plurality of contact pins 80 comprises source contact pins S, the second plurality of contact pins 81 comprises drain contact pins D and the third plurality of contact pins 82 comprises gate contact pins G, in the example of the figure only one gate contact pin.

The process advantageously comprises a step of deposition of a conductive material 55 on at least the second plurality of contact pins 81, in particular drain contact pins D, so as to create a plurality of portions of the interconnection layer 59 in correspondence with each contact pin. This conductive material 55 realizes in particular further portions of the interconnection layer 59 in correspondence with the first portion of leadframe 58A and with the third plurality of contact pins 82, in particular of the gate contact pins G.

The process then comprises a step of assembly of the chip 52 on the leadframe 58 by means of the so called "Flip chip on lead frame" technology.

More in particular, this step of assembly of the chip 52 on the leadframe 58 comprises the steps of:

picking the chip 52 from a semiconductor wafer, after suitable separation through sawing process;

rotating the chip 52 according to the so called "flip chip" technique so as to arrange its first face 54A in front of the leadframe 58, and in particular of the conductive material 55 provided thereon; and making the chip 52 adhere with the leadframe 58, so that the at least one through via 51 prearranged in this chip 52 is aligned with at least one portion of the conductive material 55 deposited on the second plurality of contact pins 81.

The process then comprises a step of distribution, in which the conductive material 55, in particular a conductive solder previously deposited on the leadframe 58, takes contact with the walls of the through via 51 and goes up inside the same filling it in and thus realizing an extended contact between the back of the chip 52 whereon the second contact is arranged, for example a drain contact, and the additional pad realized on the front of the chip 52 and in contact with the respective contact pins 81.

During the positioning step of the chip 52, following the step of deposition of the conductive material 55, further portions of this conductive material 55 being on the first portion of leadframe 58A also realize a connection between the second plurality of contact pins 80, in particular the source contact pin, and the relative contacts being on the first face 54A of the chip 52, in particular source contacts. Similarly, portions of the conductive material 55 provided on the third plurality of contact pins 82 realize a connection between them and the relative contacts being on the first face 54A of the chip, in particular gate contacts.

More in particular, in case the conductive material 55 comprises a solder paste, the step of deposition of this conductive material 55 comprises a step of dispensation of this solder paste, followed by a step of distribution of this conductive material 55 realized by a so called reflow step, wherein the solder paste, due to a thermal process which the device undergoes, melts and goes up by capillary action inside the through vias 51. Alternatively, for example by using a conductive glue as the conductive material 55, the step of distribution of this conductive glue comprises a step of dispensing a conductive glue and a step of pressing of the chip 52 on the conductive glue as dispensed suitable for obtaining the lift of the glue inside the through vias 51 followed by a curing step able to harden the conductive glue.

In conclusion, the electronic device according to an embodiment of the disclosure allows to obtain an electronic device comprising a chip enclosed in a suitable package in which all the electrodes of the chip have been brought back on a same face.

In this way, it is possible to use a package having reduced size such as a FCOL package and known assembly techniques, such as the "Flip chip" technique.

It is to be emphasized that the use of through vias for bringing an electrode placed on the back of the chip back onto its front allows for reducing the resistive contribution of the interconnection itself, also due to a suitable choice of the filling conductive material and of the metallic material that covers its walls. In particular, it will be evident for a person skilled in the art that the vertical current flow crossing the substrate of the chip is collected at the back of the chip itself and thus conveyed onto the front through the through vias. Due to the possibility of a wide diameter, to the number and to the space distribution, these have a very low resistive contribution when the current flows.

Furthermore, it is emphasized that it is not necessary to fill the through vias in with complicated final processes, so called Front End (FE) process. Advantageously according to the assembly process of the disclosure, it is in fact possible to fill these through vias in during the step of positioning of the chip inside the package.

It is also to be noted that the measures activated in the electronic device according to the disclosure make the vertical conduction devices, such as the power discretes, compatible with the assembly in FCOL packages. Since this typology of package does not demand the classic metallic interconnections (gold, copper or aluminum wires or particular metallic structures such as "Al Ribbon" or "Copper Clip"), it can be realized with a very reduced thickness, for example up to some tenths of millimeters, thus realizing an extremely compact electronic device.

The possibility provided by the present disclosure realizes, in a very simple and low cost way from the manufacturing point of view, very wide area contacts, due to the use of an adequate number of through vias with a shape and a section being suitably adapted also to the layout of the integrated circuit realized on the chip, is very important for the performances of the final device, in particular since it allows to improve the current flow between front and back of the chip, which is of particular important in the case of power chips.

All these advantages are obtained by the electronic device according to the disclosure thanks to the particular sinergy between the realization of the chip and the relative assembly in the package.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device comprising:
    a metallic structure having a plurality of connection pins;
    a chip having:
        a first surface facing said metallic structure;
        a second surface;
        a first contact on said first surface;
        a second contact on said second surface;
        a through via that extends from the first surface to the second surface; and
        a metallic layer extending from said second contact arranged on said second surface and along walls of said through via to said first surface;
    an interconnection layer having a first portion located in said through via and a second portion located between the chip and said metallic structure, said interconnection layer being configured to electrically and mechanically couple said chip to said metallic structure; and
    packaging material located around the chip.

2. The electronic device according to claim 1, wherein said first portion of said interconnection layer fills said through via.

3. The electronic device according to claim 2, wherein said first portion of said interconnection layer forms a non-rectifying contact with said metallic layer.

4. The electronic device according to claim 2, wherein said interconnection material is one of a solder paste and a conductive glue.

5. The electronic device according to claim 1 wherein the metallic layer is a first metallic layer, the device further comprising a second metallic layer on said first surface of said chip coupled to or forming said first contact.

6. The electronic device according to claim 1, further comprising a pad that includes a plurality of contact areas formed by a plurality of through vias each filled with a corresponding first portion of said interconnection layer and having second portions of said interconnection layer being arranged on a metallic structure that is in correspondence with said through vias.

7. The electronic device according to claim 6, wherein said plurality of contact areas are aligned along an edge region of said chip.

8. The electronic device according to claim 1, wherein said through via is one of a plurality of through vias, each having walls that are arranged substantially perpendicular to said first surface of said chip and are coated with said metallic layer.

9. The electronic device according to claim 1, wherein said chip comprises a vertical conduction power device that is at least one of a MOS transistor, an IGBT transistor, a BJT transistor and a diode.

10. The electronic device according to claim 1, wherein said metallic structure is divided into at least one first portion provided with at least one first contact pin and a second portion, physically separated from said first portion and provided with at least one second contact pin, said through via being coupled to said second contact pin, and said interconnection layer having at least one portion arranged between said second contact pin and said through via placing said second contact on said second surface of said chip in contact with said second contact pin.

11. The electronic device according to claim 10, wherein said interconnection layer has a third portion arranged between said first contact pin and said first contact located on said first surface of said chip.

12. The electronic device according to claim 10, wherein said first portion of said metallic structure comprises a first plurality of contact pins and said second portion of said metallic structure comprises a second plurality of contact pins, said interconnection layer having respective portions arranged between said first plurality of contact pins and said first pad connected to said first contact located on said first surface of said chip and between said second plurality of contact pins and said further pad connected to said second contact located on said second surface of said chip.

13. The electronic device according to claim 12, wherein said second portion of said metallic structure comprises a third plurality of contact pins, said interconnection layer having further portions arranged between said third plurality of contact pins and a further pad connected to a further contact located on said first surface of said chip.

14. The electronic device according to claim 1, wherein said interconnection layer includes a metallic alloy Pb/Sn/Ag.

\* \* \* \* \*